(12) United States Patent
Leonard

(10) Patent No.: US 10,597,125 B2
(45) Date of Patent: *Mar. 24, 2020

(54) HEIGHT ADJUSTABLE DEPTH FINDER APPARATUS AND SYSTEM

(71) Applicant: Timothy Mark Leonard, Greeneville, TN (US)

(72) Inventor: Timothy Mark Leonard, Greeneville, TN (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/414,271

(22) Filed: May 16, 2019

(65) Prior Publication Data

US 2019/0270497 A1 Sep. 5, 2019

Related U.S. Application Data

(63) Continuation-in-part of application No. 15/416,661, filed on Jan. 26, 2017, now Pat. No. 10,293,900.

(60) Provisional application No. 62/288,656, filed on Jan. 29, 2016.

(51) Int. Cl.

| | |
|---|---|
| *F16M 11/00* | (2006.01) |
| *B63B 49/00* | (2006.01) |
| *B63B 17/00* | (2006.01) |
| *F16M 11/26* | (2006.01) |
| *H05K 5/02* | (2006.01) |
| *H02G 11/00* | (2006.01) |
| *H05K 5/00* | (2006.01) |

(52) U.S. Cl.
CPC .............. *B63B 49/00* (2013.01); *B63B 17/00* (2013.01); *F16M 11/26* (2013.01); *H02G 11/00* (2013.01); *H05K 5/0017* (2013.01); *H05K 5/0234* (2013.01); *B63B 2017/0054* (2013.01)

(58) Field of Classification Search
CPC ......... B60R 11/02; B63B 49/00; B63B 17/00; F16M 11/06; F16M 11/18; F16M 11/26
USPC .................................. 248/121, 404; 108/147
See application file for complete search history.

(56) References Cited

U.S. PATENT DOCUMENTS

| | | | | |
|---|---|---|---|---|
| 3,210,846 | A | * 10/1965 | Balkin | ................ A61C 1/0007 433/98 |
| 5,529,272 | A | 6/1996 | Baublitz, Sr. | |
| 5,685,510 | A | * 11/1997 | Frankish | .................. A47B 9/04 108/147 |
| 6,019,325 | A | * 2/2000 | Dotson | ................... B63B 49/00 248/121 |
| 6,019,333 | A | 2/2000 | Waller | |
| 6,179,253 | B1 | 1/2001 | Cotton | |
| D441,670 | S | 5/2001 | Jackson et al. | |
| 6,352,447 | B1 | 3/2002 | Ruth | |
| 6,370,037 | B1 | 4/2002 | Schoenfish | |

(Continued)

*Primary Examiner* — Todd M Epps
(74) *Attorney, Agent, or Firm* — Pitts & Lake, P.C.

(57) ABSTRACT

A height adjustable depth finder system is provided such that a user may easily raise and lower the height at which a depth finder display is located. Height adjustability may be provided by one or more supports, with at least one support actively driven. The one or more supports may telescope to provide height adjustability and are actively driven by an actuator that may include a wire feed motor or a rack and pinion. In the event of two supports, the two supports may be perpendicular (side-by-side) or parallel (front and back) with the longitudinal axis of the boat. The longitudinal axis of the boat generally forms a "V" line at the lowest part of the hull running from the bow to the stern of the boat.

14 Claims, 11 Drawing Sheets

(56) References Cited

U.S. PATENT DOCUMENTS

| | | | |
|---|---|---|---|
| D468,652 S | 1/2003 | Steiner et al. | |
| D474,701 S | 5/2003 | Steiner et al. | |
| 6,595,144 B1 * | 7/2003 | Doyle | A47B 9/00 |
| | | | 108/147 |
| 6,791,902 B1 | 9/2004 | Steiner et al. | |
| 7,341,231 B2 | 3/2008 | Zarn | |
| 7,744,046 B1 * | 6/2010 | Lundy | B60R 11/02 |
| | | | 248/121 |
| 8,028,947 B1 | 10/2011 | Schafer | |
| 9,275,623 B2 * | 3/2016 | Caldwell | G10K 11/006 |
| 10,293,900 B1 * | 5/2019 | Leonard | B63B 49/00 |
| 2014/0057677 A1 | 2/2014 | Liubinas et al. | |

* cited by examiner

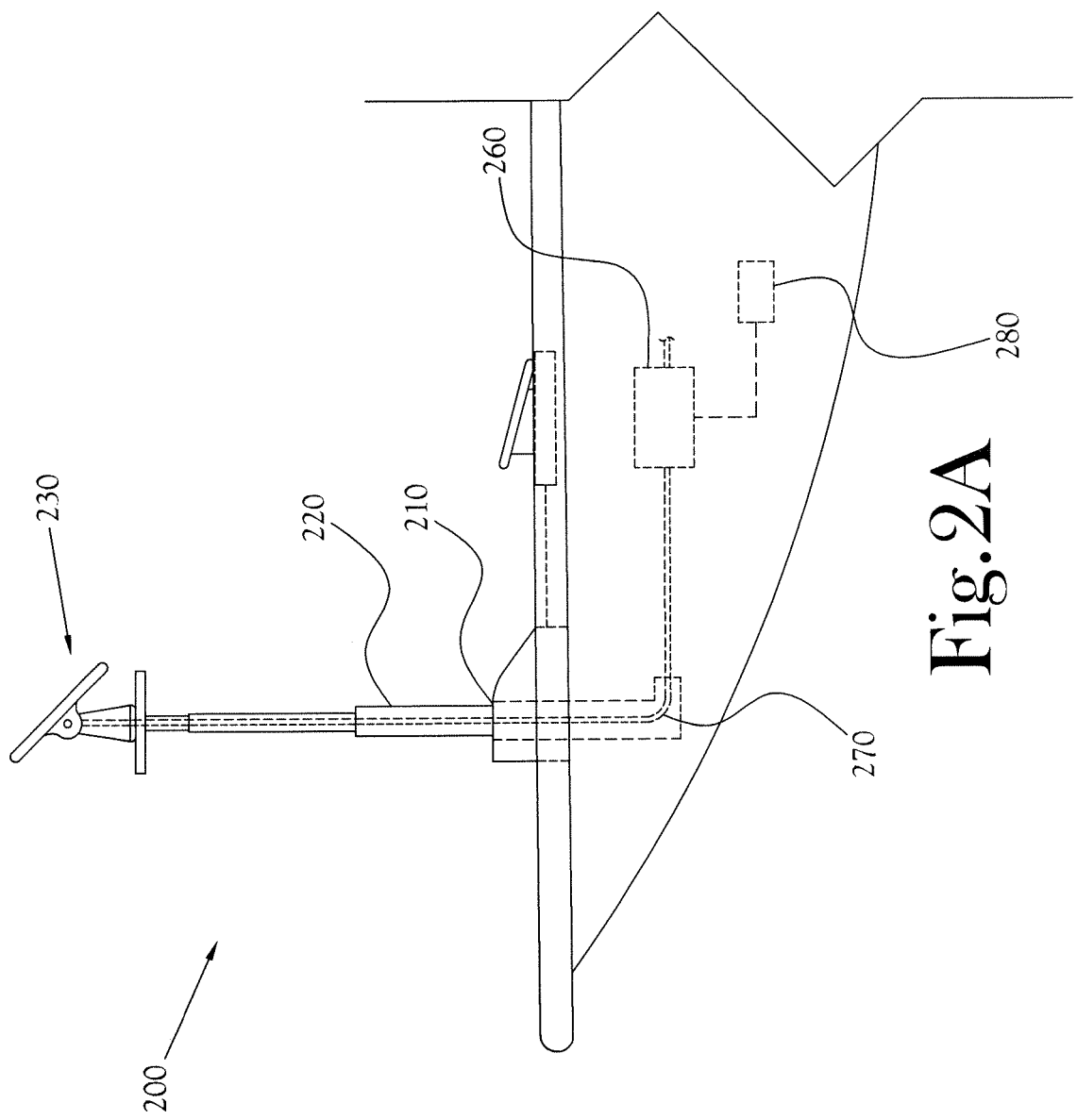

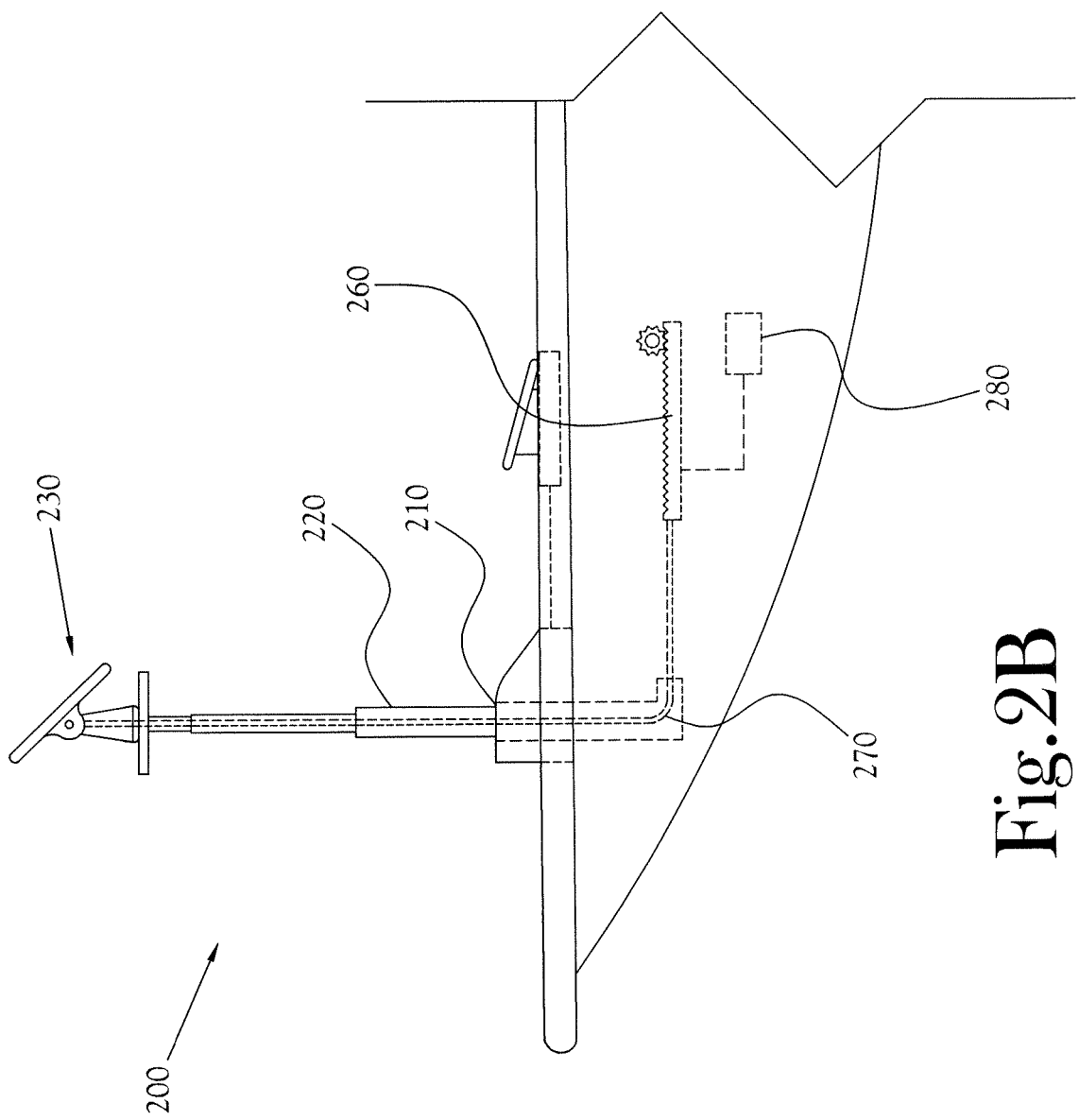

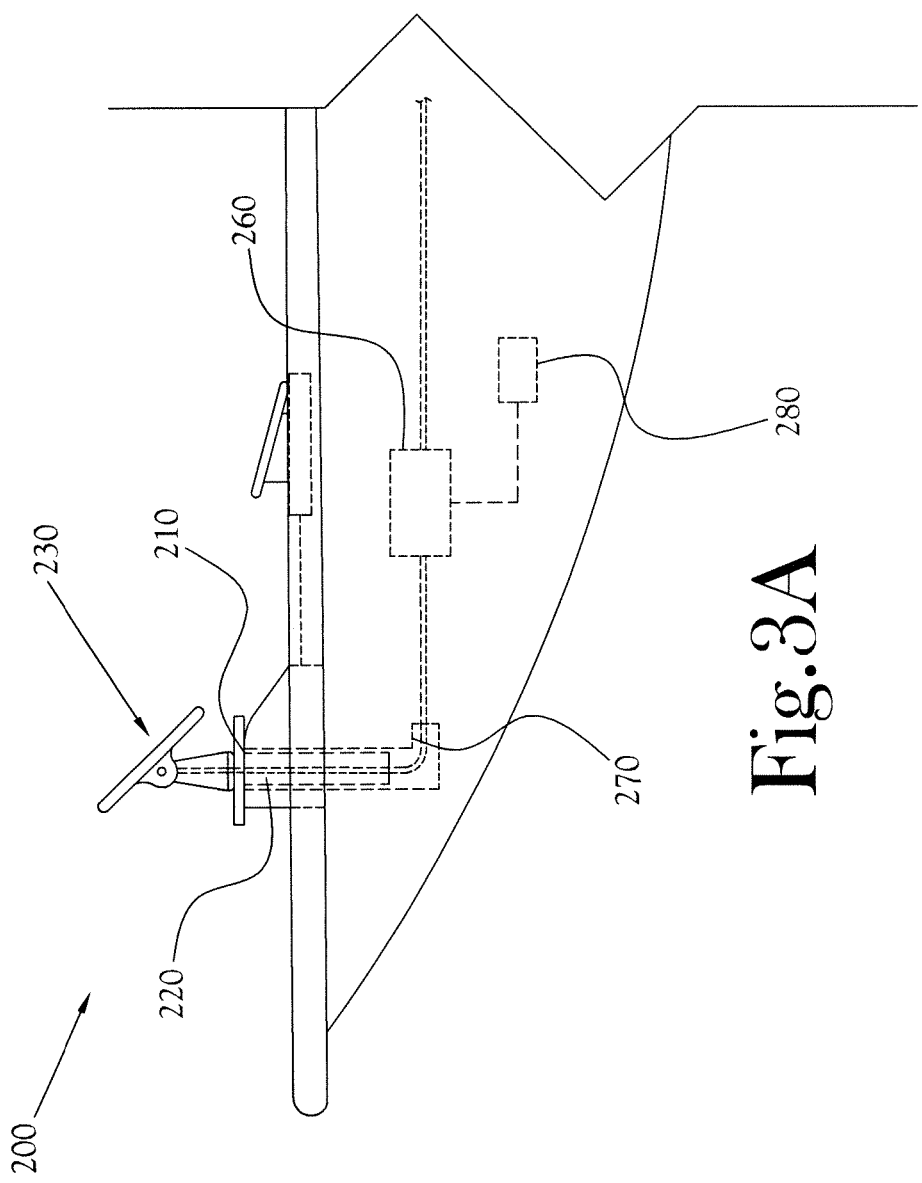

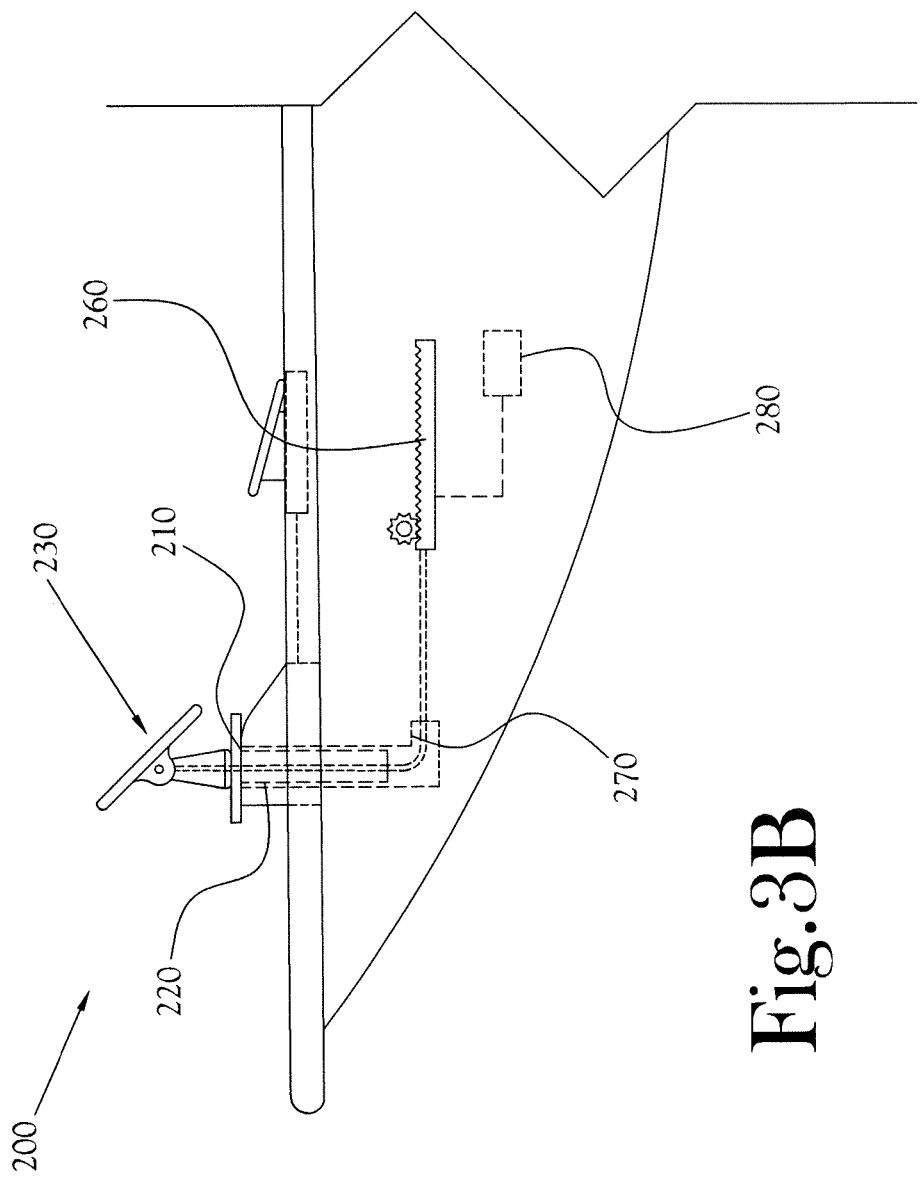

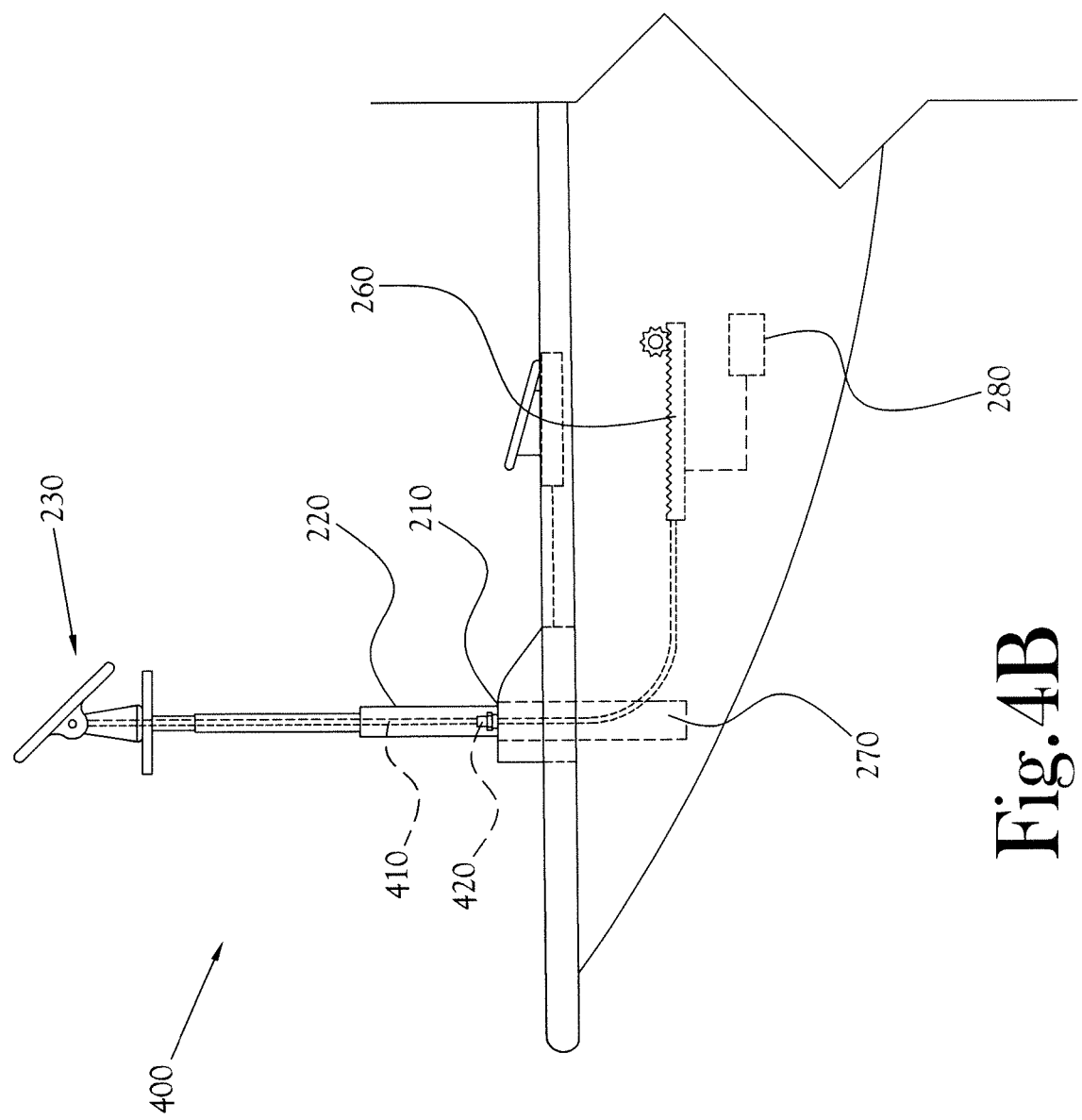

HEIGHT ADJUSTABLE DEPTH FINDER APPARATUS AND SYSTEM

REFERENCE TO RELATED APPLICATIONS

This application is a continuation-in-part of U.S. patent application Ser. No. 15/416,661, filed on Jan. 26, 2017, which claimed the benefit of U.S. Provisional Application No. 62/288,656, filed on Jan. 29, 2016, the contents of which are incorporated herein in their entirety by reference.

FIELD OF INVENTION

The present general inventive concept relates to a boat mounted depth finder, and, more particularly, a height adjustable boat mounted depth finder that can be raised and lowered by an automated operation.

BACKGROUND

Depth finders are commonplace in the use of even casual fisherman, and are helpful in navigating waters as well as locating fish. A fisherman may rely on such a device in a near continuous manner while fishing, especially when moving the boat often during fishing. The fisherman may also like to spend some of the time fishing in a standing position, and some in a sitting position, and therefore having a fixed location for the depth finder may be inconvenient for the fisherman. At the same time, not having the depth finder fixed on the boat in some manner increases the possibility of damaging or losing the device. Therefore, it may be desirable to be able to readily reposition the depth finder for different situations, and in a manner that increases the convenience of the user.

BRIEF SUMMARY

In one aspect, a height adjustable depth finder system is provided that includes at least one support having a plurality of telescoping sections, a depth finder display coupled to a top section of the at least one support, a base coupled to a bottom section of the at least one support and configured to be mounted to a portion of a boat, an actuator configured to raise and lower the depth finder display through the telescoping action of the at least one support, and a switch to selectively control the actuator to raise and lower the depth finder display.

In another aspect, a height adjustable support for a depth finder is provided that includes a support having a plurality of sections configured to be adjustable to a plurality of heights by a telescoping action, including a top section configured to receive a mounting member for a depth finder display, a base configured to be coupled to a bottom section of the support and mounted to a portion of a boat, an actuator configured to raise and lower the support to a desired height, and a switch to selectively control the actuator to raise and lower the depth finder display.

Other features and aspects may be apparent from the following detailed description, the drawings, and the claims.

BRIEF DESCRIPTION OF THE FIGURES

The following example embodiments are representative of example techniques and structures designed to carry out the objects of the present general inventive concept, but the present general inventive concept is not limited to these example embodiments. In the accompanying drawings, illustrations, and pictures, the sizes and relative sizes, shapes, and qualities of lines, entities, and regions may be exaggerated for clarity. A wide variety of additional embodiments will be more readily understood and appreciated through the following detailed description of the example embodiments, with reference to the accompanying drawings and pictures in which:

FIG. 2A illustrates a cross section of a height adjustable depth finder system with a wire feed actuator in a raised position according to another example embodiment of the present general inventive concept;

FIG. 2B illustrates a cross section of a height adjustable depth finder system with a rack and pinion actuator in a raised position with single or dual perpendicularly arranged supports according to another example embodiment of the present general inventive concept;

FIG. 3A illustrates a cross section of the height adjustable depth finder system of FIG. 2A in a lowered position;

FIG. 3B illustrates a cross section of the height adjustable depth finder system of FIG. 2B in a lowered position with a single or dual perpendicularly arranged supports;

FIG. 4B illustrates a cross section of the height adjustable depth finder system of FIG. 4A.

DETAILED DESCRIPTION

A height adjustable depth finder system is provided such that a user may easily raise and lower the height at which a depth finder display is located. Height adjustability may be provided by one or more supports, with at least one support actively driven. The one or more supports may telescope to provide height adjustability and are actively driven by an actuator that may include a wire feed motor or a rack and pinion. In the event of two supports, the two supports may be perpendicular (side-by-side) or parallel (front and back) with the longitudinal axis of the boat. The longitudinal axis of the boat generally forms a "V" line at the lowest part of the hull running from the bow to the stern of the boat.

A wire feed motor is a type of motor that converts the rotational energy of the motor shaft to linearly move a wire or cable. Generally, the motor turns wheels with friction surfaces that "hold" and linearly move the wire or cable as the wire or cable is forced between the wheels. Friction between the wire or cable and wheels may be increased with teeth, slots, groves, and the like.

A rack and pinion includes a longitudinal member, such as a bar or rod, with teeth cut in at least one longitudinal side of the longitudinal member. These teeth are engaged by the teeth of a pinion gear that is rotated by a motor. The rack cannot move unless the pinion gear moves. A flexible cable or wire may be attached to an end of the longitudinal member. In this way, when the rack moves away from the support or supports, the display lowers as the flexible cable or wire is moved away from the support or supports, and when the rack moves toward the support or supports, the display is raised as the rack forces the flexible cable or wire toward the support or supports.

The capability to easily raise and lower the height of the depth finder display is advantageous to the user who may wish for the display to be at a maximum height while the user is in a standing position, and who may wish for the display to be at a lower position when seated nearby. Also, the user may wish for the display to be at the lowest possible position when the display is not in use, such as when not fishing or when navigating well known waters.

Another advantage of the height adjustable display support system is that the user can raise and lower the display with a simple foot action, and the system can therefore be used when the user is using both hands for bait casting, trolling maneuvers, and so on. The user may also raise and lower the display by actuating a button on a handheld remote control, such as a key fob. Being able to adjust the height of the support (stand, mount, etc.) on which the display is attached through an easily accessed automated process provides these and many other advantages.

Figure 1A:
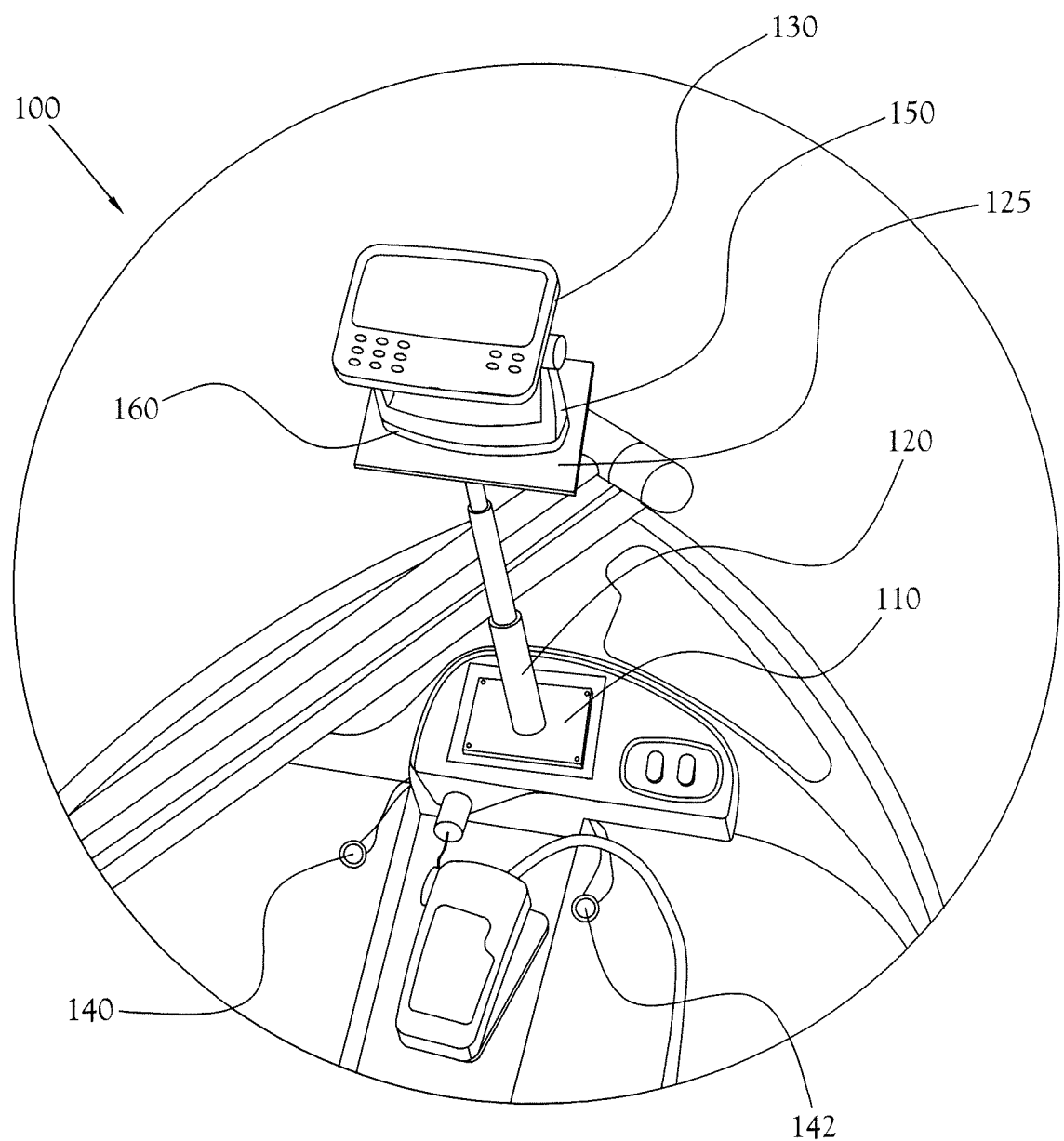
FIG. 1A illustrates a view of a height adjustable depth finder system having a single support according to an example embodiment of the present general inventive concept.
Figure 1B:
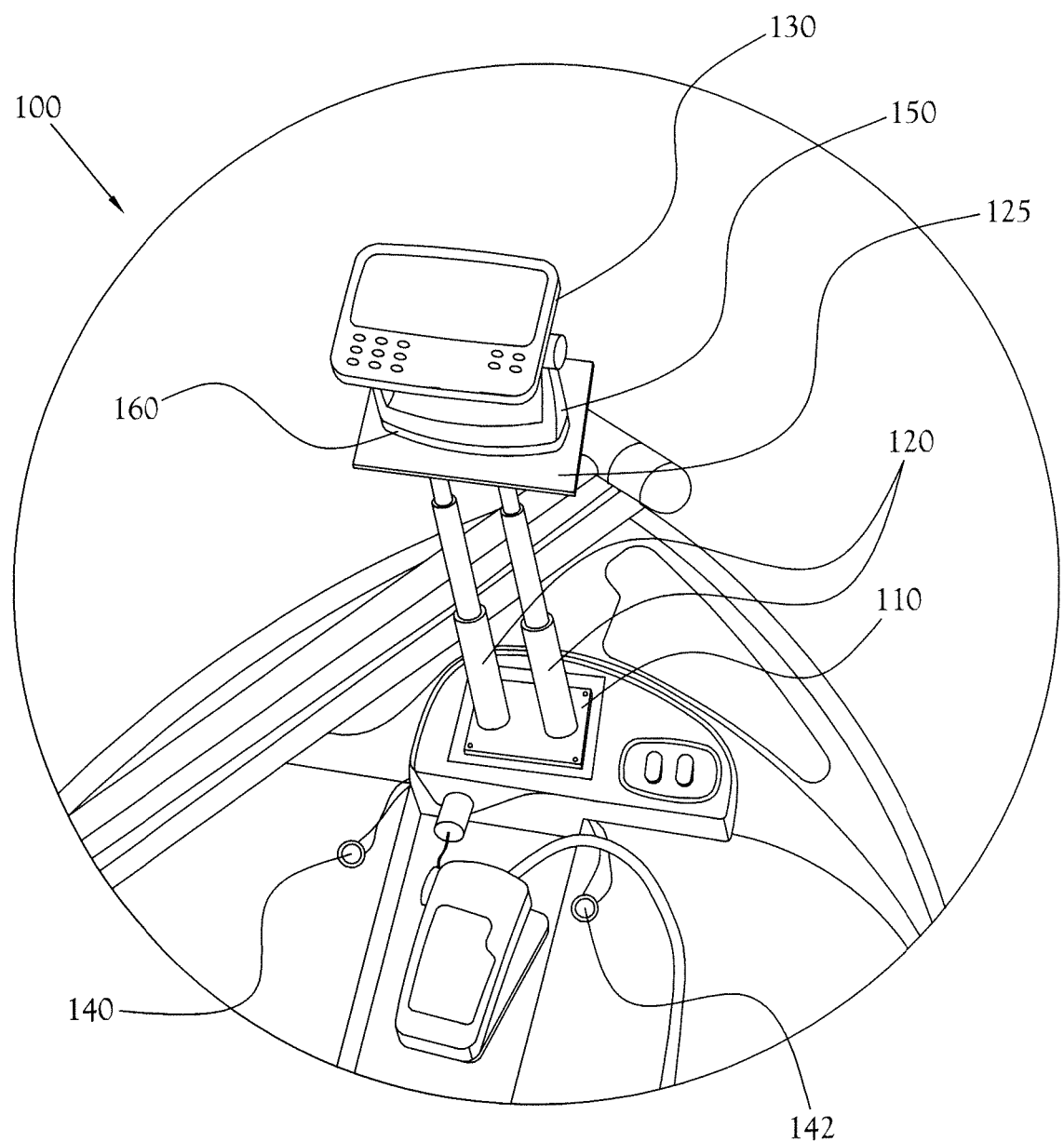
FIG. 1B illustrates a view of a height adjustable depth finder system having dual supports positioned perpendicular to the longitudinal axis of the boat according to an example embodiment of the present general inventive concept.
Figure 1C:
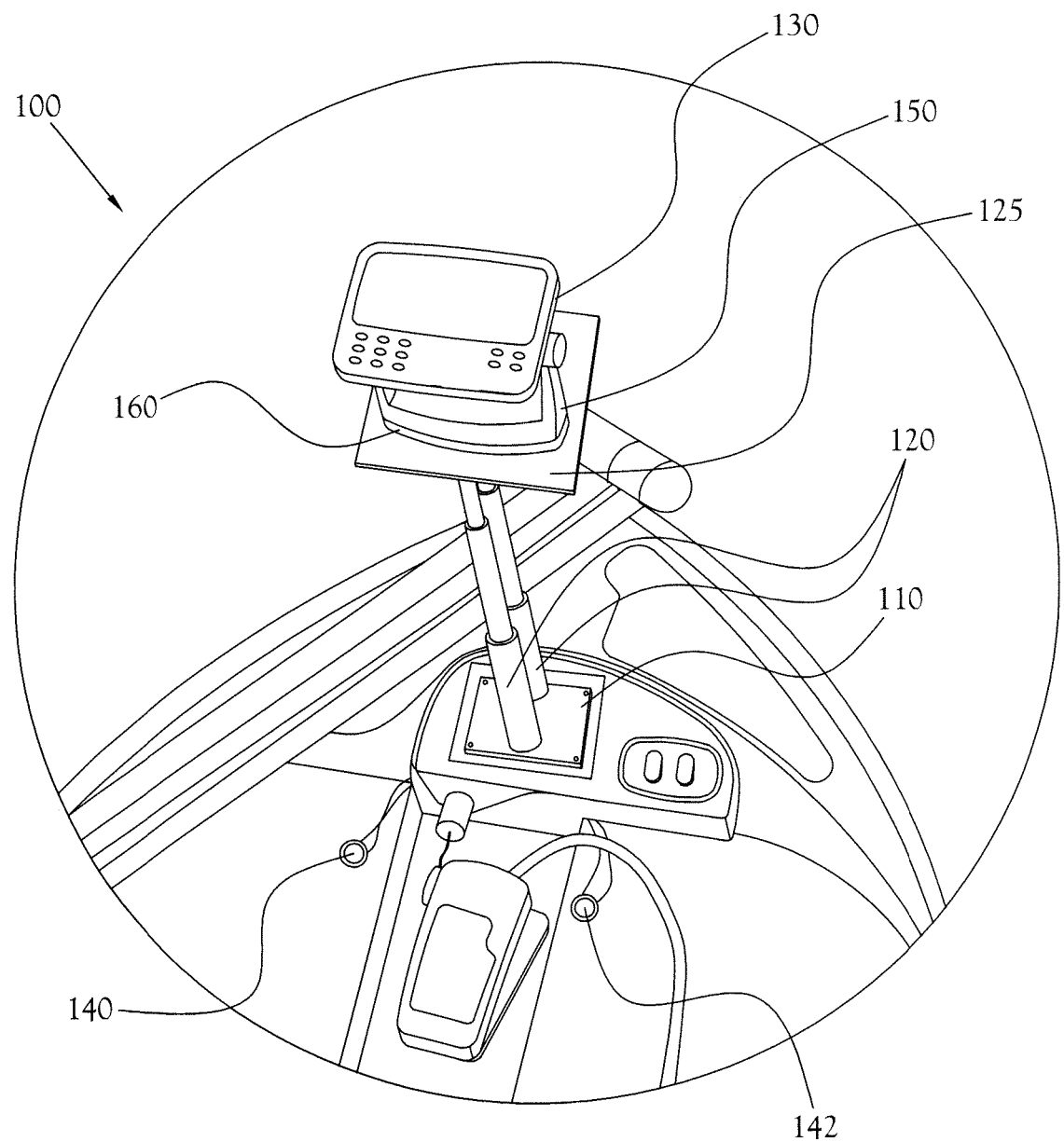
FIG. 1C illustrates a view of a height adjustable depth finder system having dual supports positioned parallel to the longitudinal axis of the boat according to an example embodiment of the present general inventive concept.

FIG. 1A illustrates a view of a height adjustable depth finder system 100 with a single support 120. Similarly, FIG. 1B and FIG. 1C illustrate views of the height adjustable depth finder system 100 with dual supports 120. As illustrated in the figures, the height adjustable depth finder system 100 includes a base 110 attached to a portion of the boat such as, for example, a hull floor of the boat, and a support or supports 120 extending from the base 110 to support a depth finder display 130 coupled directly or indirectly thereto. The depth finder display 130 is coupled to a top section of the support or supports 120. The depth finder display 130 may be directly coupled to the top section of the support or supports 120, or may be coupled to an intermediate member 125, and the like, which is coupled to the top section of the support or supports 120.

An up switch 140 and a down switch 142 are provided proximate to the base 110 and are configured such that a user may use a foot to cause the support or supports 120 to extend or retract in order to raise or lower, respectively, the display 130. While not shown in the figures, a remote may wirelessly communicate with the system and also be used to extend or retract the support or supports 120. Although the switches 140, 142 are illustrated in this example as being proximate and connected to the base 110, in other embodiments the switches may be integrated into a top surface of the base 110. In other words, in various example embodiments the switches 140, 142 may be located at various locations on the base 110, formed separately from the base 110 to communicate with the system in a wired or wireless manner, or formed to be selectively attached to and detached from the base 110. Also, while the switches 140, 142 in FIG. 1A and in FIG. 1B are illustrated as being two buttons, one for raising and one for lowering the display 130, in various example embodiments the switches 140, 142 may be configured in any of a number of different ways, such as a single toggle, etc. A power switch may be provided to the base 110 to power the height adjustable depth finder system 100.

In FIG. 1A, FIG. 1B, and FIG. 1C the support or supports 120 are represented to have three telescoping sections, but any number of telescoping sections may be used that are consistent with providing the desired range of motion to the support or supports 120. The display 130 is coupled to a top section of the support or supports 120 by a pivot member 150 and universal mounting plate 160, which may be included with a conventional depth finder or, for example, in a separately supplied mounting kit, that allows the display 130 to be pivoted relative to the support or supports 120. In various example embodiments, a coupling member coupling the display 130 to the support or supports 120 may itself be pivotable relative to the support or supports 120 and/or the display 130, and in other various example embodiments the display 130 may be coupled to the support or supports 120 in a fixed position. In any of these embodiments, the intermediate member 125 may reside between the display 130 and the support or supports 120. In various example embodiments, a universal mounting plate 160 may be provided along with the support or supports 120. In various example embodiments, the bottom section of the support or supports 120 may be configured to be pivotable relative to the base 110. In various example embodiments of the present general inventive concept, a top section of the support or supports 120 may be configured to be coupled to any number of separately provided depth finder displays, tablet displays in communication with depth finders by wired or wireless communications, and so on. The display 130 may be a 7-12" tablet device, for example, but any number of displays may be incorporated.

Figure 2C:
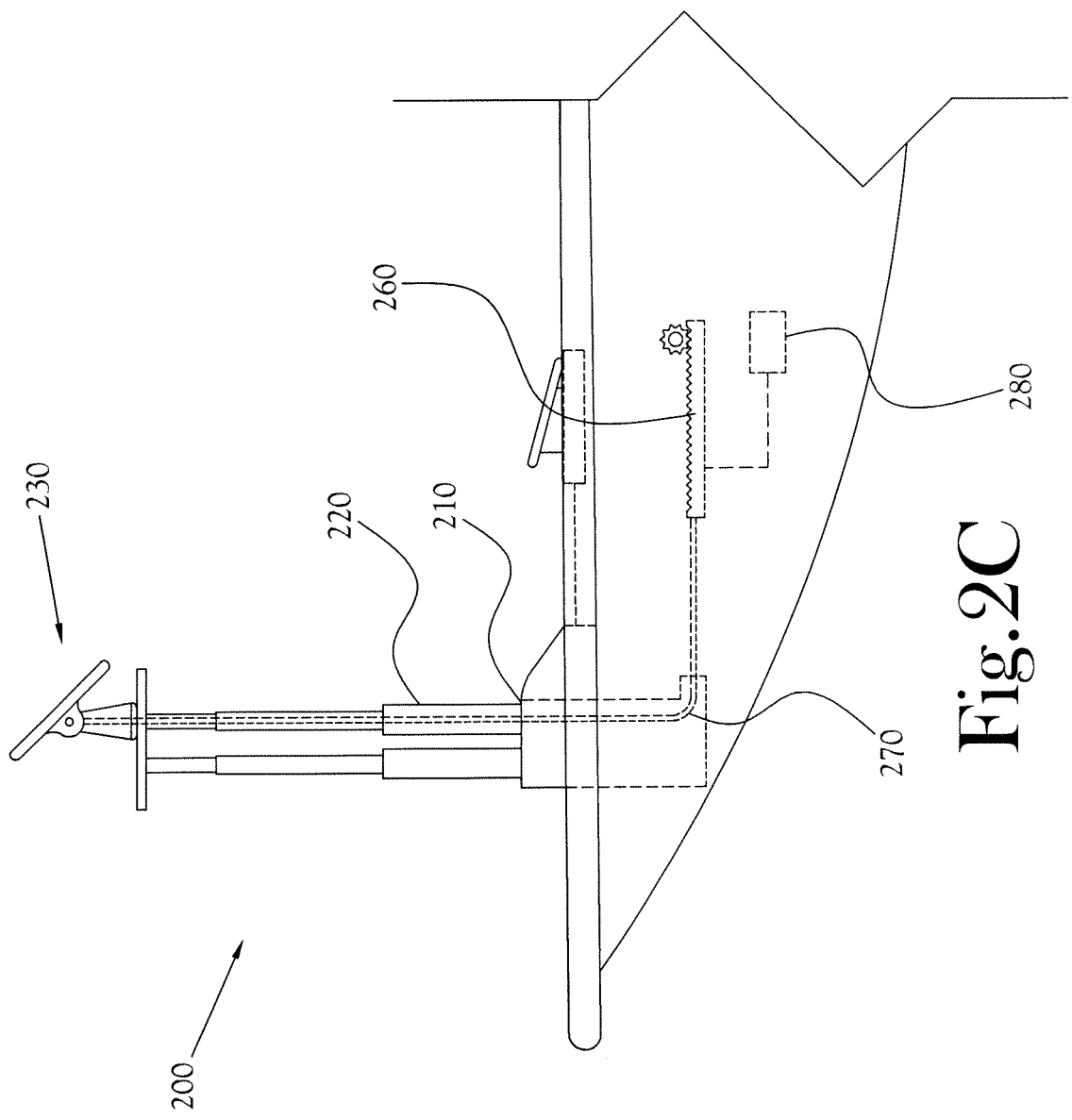
FIG. 2C illustrates a cross section of a height adjustable depth finder system with a rack and pinion actuator in a raised position with dual parallel arranged supports according to another example embodiment of the present general inventive concept.
Figure 3C:
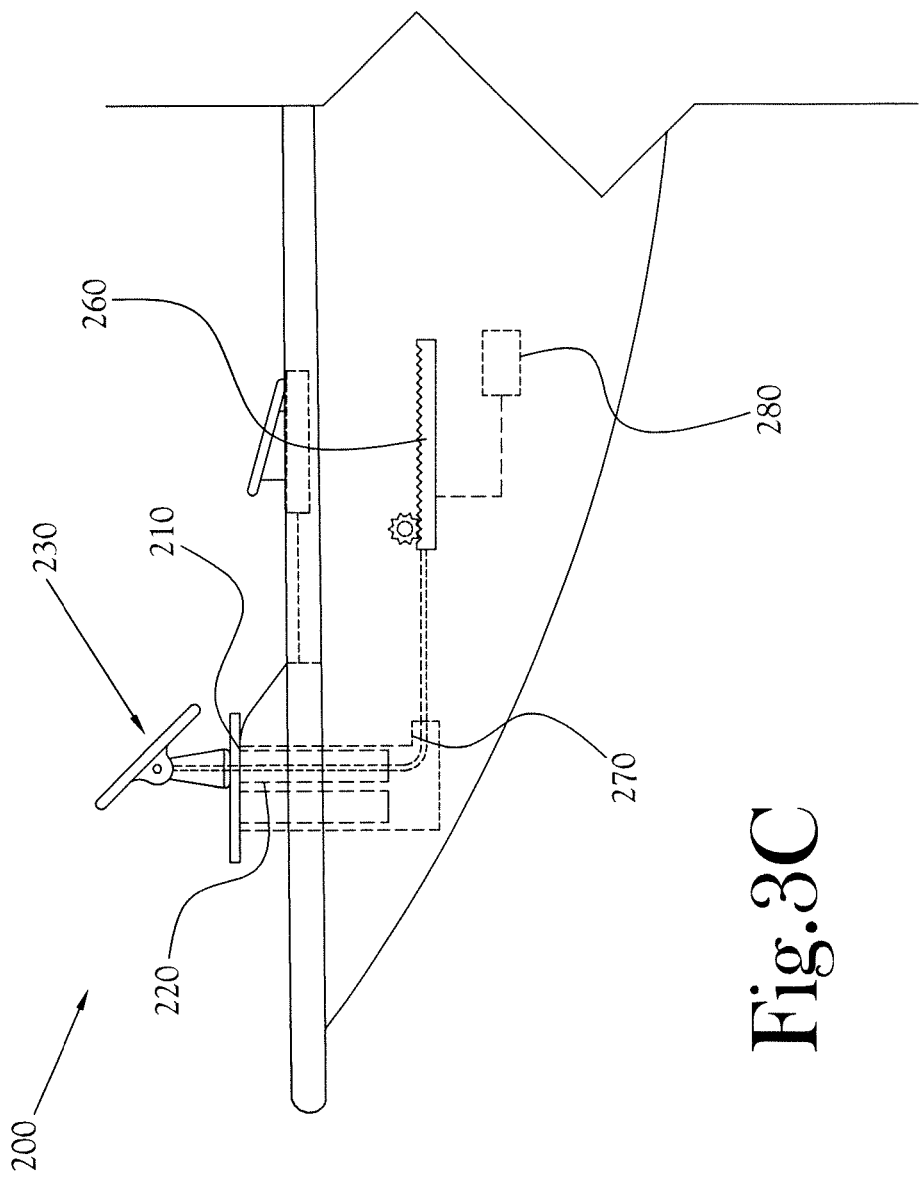
FIG. 3C illustrates a cross section of the height adjustable depth finder system of FIG. 2C in a lowered position with a dual parallel arranged supports.

FIG. 2A illustrates a cross section of a height adjustable depth finder system 200 where an actuator 260 may be a wire feed motor in a raised position, while FIG. 3A illustrates a cross section of the height adjustable depth finder system 200 of FIG. 2A in a lowered position. FIG. 2B and FIG. 2C illustrate a cross section of the height adjustable depth finder system 200 where the actuator 260 is a rack and pinion in a raised position, while FIG. 3B and FIG. 3C illustrate a cross section of the height adjustable depth finder system 200 of FIG. 2B and FIG. 2C, respectively, in a lowered position. In comparison to a wire feed motor, the rack and pinion ensures that the position of the display is fixed and resistant to slipping up or down when not being raised or lowered.

Similar to the system 100 illustrated in FIG. 1A, FIG. 1B, and FIG. 1C, the system 200 illustrated in FIGS. 2A, 2B, 2C, 3A, 3B, and 3C may include a base 210, support or supports 220, and a display 230. FIGS. 2A, 2B, 2C, 3A, 3B, and 3C also illustrate an actuator 260 that may be installed below the hull floor to cause the raising and lowering of the support or supports 220, and therefore the display 230. An advantage of having parallel located supports 120, 220, as represented in FIGS. 1C, 2C, and 3C, is that the supports 120, 220 may extend deeper below the hull floor of the boat than if perpendicularly mounted, as the supports 120, 220 may be located above the lowest line forming the "V" in the hull.

In FIGS. 2A and 3A, the actuator 260 may include a wire feeder motor that drives a flexible cable in a forward direction to cause the display 230 to raise, and drives the flexible cable in a reverse direction to cause the display 230 to lower. In FIGS. 2B, 2C, 3B, and 3C, the actuator 260 may include a rack and pinion that drives a flexible cable in a forward direction to cause the display 230 to be raised, and drives the flexible cable in a reverse direction to lower the display 230 to a lowered position. However, unlike for a wire feed motor, the flexible cable cannot undesirably slip through the motor when attached to the rack of the rack and pinion.

The actuator 260 may be powered by a battery 280 that is provided solely for the system 200, or may be in electrical communication with other electrical systems provided in the boat to obtain power for the raising and lowering of the support or supports 220. Thus, a user, by engaging the foot control or key fob, controls operation of the actuator 260 to drive the flexible cable, causing movement of the support or supports 220. In this example embodiment, the flexible cable is provided in a guide member such as, for example, tubing or flexible conduit underneath the top deck, or hull floor, of the boat in order to guide the flexible cable. The guide member may include any number of elbows or other such configurations needed to properly guide the flexible cable. In an example embodiment, the guide member is provided with an elbow portion 270 to guide the flexible cable in the direction of the support or supports 220. The guide member may also be configured to receive one or more portions of the support or supports 220 when in a fully lowered position. The flexible cable may be coupled to the top section of the support or supports 220 to push the display 230 up in a raising operation, and to pull the display 230 down in a lowering operation.

While not shown in the figures, when dual supports are used, one or both may be actively driven by a flexible cable. If one of the two supports is actively driven, the second support is free to move up and down, but provides side to side stability to the display 230. If both of the two supports are actively driven, then both supports move up and down in response to a flexible cable in each. In this instance, when wire feed motors are used, two wire feed motors may be used—one to drive each flexible cable and each support, respectively. While it is possible to use two rack and pinions, thus one for each flexible cable, preferably, the rack may terminate in a cross-bar to which the two flexible cables are attached.

Figure 4A:
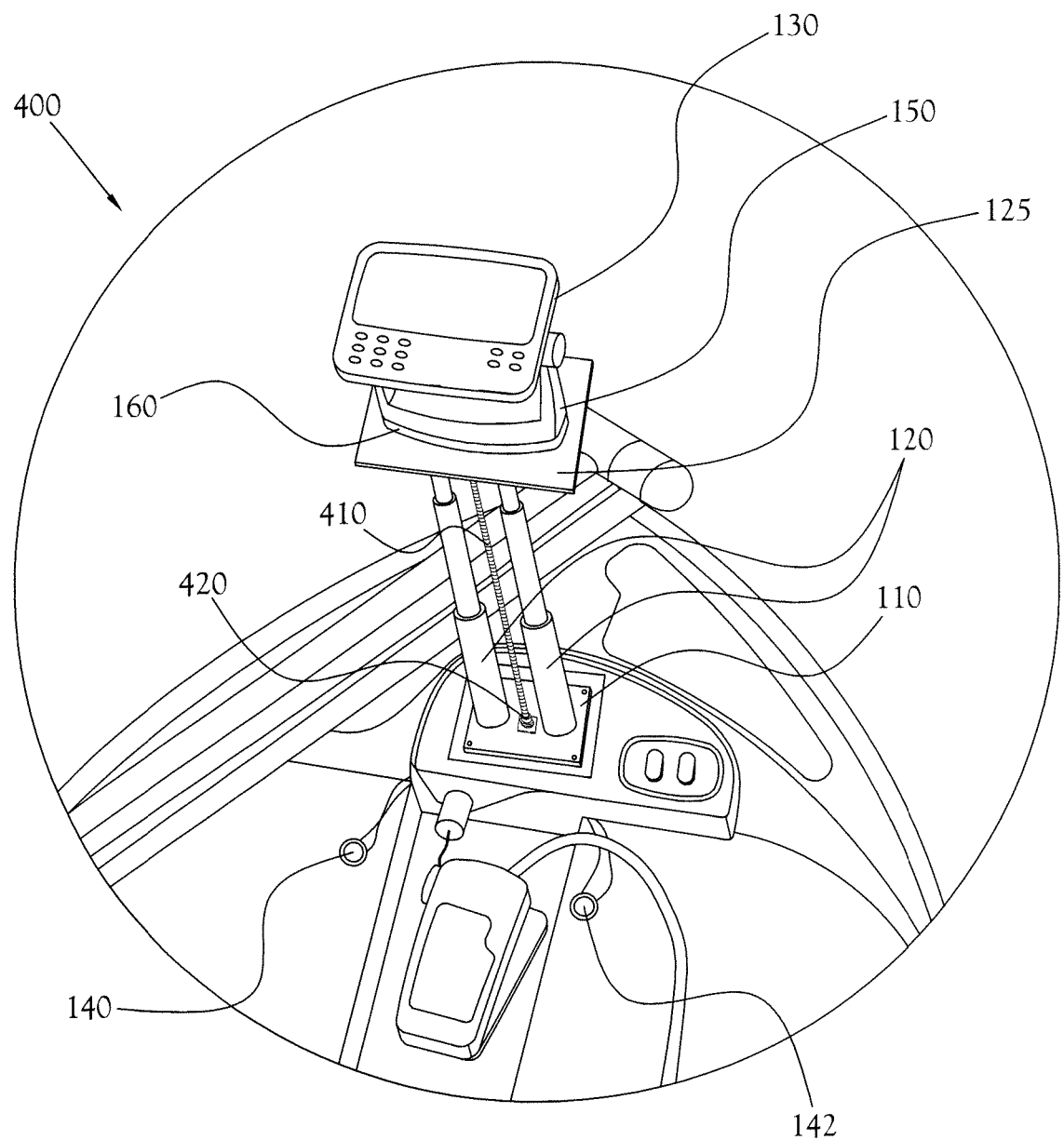
FIG. 4A illustrates a view of a height adjustable depth finder system having dual supports positioned perpendicular to the longitudinal axis of the boat according to another example embodiment of the present general inventive concept.

FIG. 4A illustrates a view of a height adjustable depth finder system having dual supports positioned perpendicular to the longitudinal axis of the boat according to another example embodiment of the present general inventive concept, and FIG. 4B illustrates a cross section of the height adjustable depth finder system of FIG. 4A. As previously described, various example embodiments of the present general inventive concept such as the configuration illustrated in FIG. 2C include a flexible cable that is at least partially housed by, and driven through, one of the supports 220 to raise and lower the display 230. Various other example embodiments, such as the configuration illustrated in FIGS. 4A-4B, provide a system 400 that includes a flexible cable 410 to drive the display 230 that is not housed by either of the supports 220, but is instead generally exposed at least at points above between the base 110 and intermediate member 125. The flexible cable 410 of this example embodiment passes through a cable guide 420 provided in the base 110, and may again be generally exposed between a bottom of the hull floor and the actuator 260. Exposing the flexible cable 410, rather than passing the cable through support member, may allow the flexible cable 410 to move more freely and not suffer interference with the previously described guide members of the previous example embodiment that surround extended lengths of the cables. Although the example embodiment illustrated in FIGS. 4A-4B show two support members in a side by side arrangement, various other numbers and/or arrangements of the support members may be provided without departing from the scope of the present general inventive concept. In various example embodiments, the flexible cable 410 may extend to the bottom of the intermediate member 125, or may pass through to some point on or in the display 130. The cable guide 420 may be formed integrally with the base 110, or may be coupled to the base 110 at a desired position after an opening is provided in the base 110 at a desired location. The cable guide 420 may be formed in a host of different configurations, such as a bolt with a through hold configured such that the flexible cable 410 may pass therethrough, and the bolt may simply thread into the base 110 and/or hull floor of the boat. In various example embodiments the cable guide 420 may be configured to be couplable to the base 110 and/or a bottom of the hull floor of the boat to maintain the position of the cable guide 410. In various example embodiments, the cable guide 420 may simply be configured as a through hold in the base 110 itself, in which case a corresponding through hole must be formed in the hull floor of the boat.

The cable guide may be configured with a through hole configured such that the flexible cable passes therethrough. The cable guide may be configured to be couplable to the base and a bottom of the hull floor of the boat.

The present general inventive concept is not limited to the configuration and/or components illustrated in FIGS. 2A, 2B, 2C, 3A, 3B, 3C, 4A,or 4B. For example, the actuator 260 may be adjacent or integral to the base 210, and the flexible cable or cables may be semi-rigid in a fashion that allows spooling of the cable or cables inside the base 210 or the actuator 260 housing, but still retain enough rigidity to force the extension of the support or supports 220 and maintain the desired height of the display 230. Also, various example embodiments may utilize any of a host of other types of actuators. For example, a hydraulic motor or motors may be used in place of the wire feeder motor to serve as the actuator 260.

In various example embodiments, the support system may be configured to use separately provided depth finder displays, which may be coupled to the support or supports in any of a host of ways. For example, a RAM® mount may be incorporated with the support or supports to couple a variety of different displays onto the support or supports.

According to various example embodiment of the present general inventive concept, a height adjustable depth finder system may include one or two supports having a plurality of sections configured to be adjustable to a plurality of heights by a telescoping action, a depth finder display configured to be coupled to a top section of the support or supports, a base configured to be coupled to a bottom section of the support or supports and mounted to a portion of a boat, an actuator configured to raise and lower the depth finder display through the telescoping action of the support or supports, and a switch or fob to selectively control the actuator to raise and lower the depth finder display.

The system may further include a flexible cable coupled to the top section of one or more supports and configured to be driven by the actuator or actuators to raise and lower the depth finder display. The actuator/s may include a wire feeder motor or rack and pinion. The actuator/s may be configured to be installed below a hull floor of a boat. The system may further include one or more guide members configured to guide the flexible cable or cables during raising and lowering operations. The switch may be configured to be controlled by a foot of a user or by a wireless key fob. The switch may be configured to be integrated with the base. The depth finder display may be coupled to the top section of the support or supports by a pivot member configured such that the depth finder display is pivotable relative to the top section.

According to various example embodiments of the present general inventive concept, a support or supports capable of being used with any number of otherwise available depth finders may be provided, and may include a height adjustable support or supports for a depth finder including a support or supports having a plurality of sections configured to be adjustable to a plurality of heights by a telescoping action, including a top section configured to receive a mounting member for a depth finder display, a base configured to be coupled to a bottom section of the support or supports and mounted to a portion of a boat, an actuator or actuators configured to raise and lower the support or supports to a desired height, and a switch to selectively control the actuator or actuators to raise and lower the depth finder display.

According to various example embodiments of the present general inventive concept, a height adjustable depth finder system may be provided including at least one support having a plurality of telescoping sections, a depth finder display coupled to a top section of the at least one support, a base coupled to a bottom section of the at least one support and configured to be mounted to a portion of a boat, a flexible cable coupled to the top section of the at least one support and configured to be driven to raise and lower the depth finder display, a cable guide configured to be installed in the base, and to guide the flexible cable through the base and through a hull floor of the boat, an actuator configured to raise and lower the depth finder display through a telescoping action of the at least one support by driving the flexible cable, and a switch to selectively control the actuator to raise and lower the depth finder display. The actuator may be a wire feed motor. The actuator may be configured to be installed below the hull floor of the boat. The switch may be configured to be controlled by a foot of a user. The switch may be integrated with the base. The depth finder display may be coupled to the top section of the at least one support by a pivot member configured such that the depth finder display is pivotable relative to the top section of the at least one support. The system may further include a second support having a plurality of telescoping sections, where a second top section of the second support is coupled to the depth finder display. The at least one support and the second support may be arranged perpendicular to a "V" line of a hull. The at least one support and the second support may be arranged parallel to a "V" line of a hull. The actuator may be a rack and pinion. The flexible cable may be coupled to a rack of a rack and pinion actuator. The switch may be configured to be controlled by a wireless key fob. The cable guide may be configured with a through hole configured such that the flexible cable passes therethrough. The cable guide may be configured to be couplable to the base and a bottom of the hull floor of the boat.

Various changes, modification, and equivalents of the structures and fabrication techniques described herein will be suggested to those of ordinary skill in the art. The progression of fabrication operations described are merely examples, however, and the sequence type of operations is not limited to that set forth herein and may be changed as is known in the art, with the exception of operations necessarily occurring in a certain order. Also, description of well-known functions and constructions may be simplified and/or omitted for increased clarity and conciseness.

Note that spatially relative terms, such as "up," "down," "right," "left," "beneath," "below," "lower," "above," "upper" and the like, may be used herein for ease of description to describe one element or feature's relationship to another element(s) or feature(s) as illustrated in the figures. Spatially relative terms are intended to encompass different orientations of the device in use or operation in addition to the orientation depicted in the figures. For example, if the device in the figures is turned over or rotated, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Herein, the term "depth finder" is used generally for a variety of devices that may be employed by a user on a boat for depth finding and/or fish locating purposes. "Depth finder displays", as used herein, may refer generally to the depth finder device, a separately configured display used in conjunction with the depth finder device, a display table configured to display information communicated from a separate depth finder device through wired or wireless communication, and so on.

Numerous variations, modifications, and additional embodiments are possible, and accordingly, all such variations, modifications, and embodiments are to be regarded as being within the spirit and scope of the present general inventive concept. For example, regardless of the content of any portion of this application, unless clearly specified to the contrary, there is no requirement for the inclusion in any claim herein or of any application claiming priority hereto of any particular described or illustrated activity or element, any particular sequence of such activities, or any particular interrelationship of such elements. Moreover, any activity can be repeated, any activity can be performed by multiple entities, and/or any element can be duplicated.

It is noted that the simplified diagrams and drawings included in the present application do not illustrate all the various connections and assemblies of the various components, however, those skilled in the art will understand how to implement such connections and assemblies, based on the illustrated components, figures, and descriptions provided herein, using sound engineering judgment. Numerous variations, modification, and additional embodiments are possible, and, accordingly, all such variations, modifications, and embodiments are to be regarded as being within the spirit and scope of the present general inventive concept.

While the present general inventive concept has been illustrated by description of several example embodiments, and while the illustrative embodiments have been described in detail, it is not the intention of the applicant to restrict or in any way limit the scope of the general inventive concept to such descriptions and illustrations. Instead, the descriptions, drawings, and claims herein are to be regarded as illustrative in nature, and not as restrictive, and additional embodiments will readily appear to those skilled in the art upon reading the above description and drawings. Additional modifications will readily appear to those skilled in the art. Accordingly, departures may be made from such details without departing from the spirit or scope of applicant's general inventive concept.

The invention claimed is:

1. A height adjustable depth finder system, comprising:
   at least one support having a plurality of telescoping sections;
   a depth finder display coupled to a top section of the at least one support;

a base coupled to a bottom section of the at least one support and configured to be mounted to a portion of a boat;

a flexible cable coupled to the top section of the at least one support and configured to be driven to raise and lower the depth finder display;

a cable guide configured to be installed in the base, and to guide the flexible cable through the base and through a hull floor of the boat;

an actuator configured to raise and lower the depth finder display through a telescoping action of the at least one support by driving the flexible cable; and a switch to selectively control the actuator to raise and lower the depth finder display.

2. The system of claim 1, where the actuator is a wire feed motor.

3. The system of claim 1, where the actuator is configured to be installed below the hull floor of the boat.

4. The system of claim 1, where the switch is configured to be controlled by a foot of a user.

5. The system of claim 4, where the switch is integrated with the base.

6. The system of claim 1, where the depth finder display is coupled to the top section of the at least one support by a pivot member configured such that the depth finder display is pivotable relative to the top section of the at least one support.

7. The system of claim 1, further comprising a second support having a plurality of telescoping sections, where a second top section of the second support is coupled to the depth finder display.

8. The system of claim 7, where the at least one support and the second support are arranged perpendicular to a "V" line of a hull.

9. The system of claim 7, where the at least one support and the second support are arranged parallel to a "V" line of a hull.

10. The system of claim 1, where the actuator is a rack and pinion.

11. The system of claim 1, where the flexible cable is coupled to a rack of a rack and pinion actuator.

12. The system of claim 1, where the switch is configured to be controlled by a wireless key fob.

13. The system of claim 1, where the cable guide is configured with a through hole configured such that the flexible cable passes therethrough.

14. The system of claim 13, where the cable guide is configured to be couplable to the base and a bottom of the hull floor of the boat.

* * * * *